(12) United States Patent
Xie et al.

(10) Patent No.: US 11,258,051 B2
(45) Date of Patent: Feb. 22, 2022

(54) DISPLAY PANEL, PREPARATION METHOD THEREOF AND DISPLAY DEVICE

(71) Applicant: BOE Technology Group Co., Ltd., Beijing (CN)

(72) Inventors: Chunyan Xie, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 56 days.

(21) Appl. No.: 16/923,577

(22) Filed: Jul. 8, 2020

(65) Prior Publication Data
US 2021/0013454 A1    Jan. 14, 2021

(30) Foreign Application Priority Data

Jul. 11, 2019  (CN) .......................... 201910623361.4

(51) Int. Cl.
*H01L 51/52*  (2006.01)
*H01L 27/32*  (2006.01)
*H01L 51/56*  (2006.01)

(52) U.S. Cl.
CPC ........ *H01L 51/5281* (2013.01); *H01L 27/322* (2013.01); *H01L 27/323* (2013.01); *H01L 27/3234* (2013.01); *H01L 51/5293* (2013.01); *H01L 51/56* (2013.01)

(58) Field of Classification Search
CPC . H01L 51/5281; H01L 27/322; H01L 27/323; H01L 27/3234; H01L 51/5293; H01L 51/56
See application file for complete search history.

(56) References Cited

U.S. PATENT DOCUMENTS

2020/0328373 A1    10/2020   Huang et al.
2021/0288293 A1*   9/2021    Cho .................. G06F 3/0445

FOREIGN PATENT DOCUMENTS

| CN | 107359185 A1 | 11/2017 |
|----|--------------|---------|
| CN | 108594524 A1 | 9/2018  |
| CN | 207853957 U  | 9/2018  |
| CN | 108681131 A  | 10/2018 |
| CN | 108957855 A  | 12/2018 |
| CN | 109120753 A1 | 1/2019  |
| CN | 109411519 A1 | 3/2019  |
| CN | 109545826 A1 | 3/2019  |
| WO | 2019205627 A1 | 10/2019 |

OTHER PUBLICATIONS

Chinese Office Action for corresponding application 201910623361.4 dated Aug. 11, 2021.
Chinese Office Action for corresponding application 201910623361.4 dated Feb. 25, 2021.

* cited by examiner

*Primary Examiner* — Kyoung Lee
(74) *Attorney, Agent, or Firm* — Arent Fox LLP; Michael Fainberg

(57) ABSTRACT

Disclosed are a display panel, a preparation method thereof and a display device. The display panel includes: a display substrate having a through hole which runs through the display substrate in a thickness direction; and an anti-reflective film, where the anti-reflective film is disposed on a light-emitting surface of the display substrate, the anti-reflective film includes a light-transmitting structure and an anti-reflective structure, and an orthographic projection of the light-transmitting structure on the display substrate covers the through hole.

14 Claims, 3 Drawing Sheets

DISPLAY PANEL, PREPARATION METHOD THEREOF AND DISPLAY DEVICE

CROSS REFERENCE TO RELATED APPLICATIONS

The present application claims the priority of Chinese Patent Application No. 201910623361.4, filed with the China National Intellectual Property Administration on Jul. 11, 2019, the contents of which are incorporated by reference herein in its entirety.

FIELD

The present disclosure relates to the field of display technology, in particular to a display panel, a preparation method thereof and a display device.

BACKGROUND

A full-screen display device in the related art is generally provided with a camera module configured to capture images at a side of a display surface of the display device. Through hole for placing the camera module is often formed by integrated cutting on a display area of the display module. Ambient light at the display surface passes through the through hole, to allow the camera module have a good lighting effect.

SUMMARY

A display panel, a preparation method thereof and a display device are provided according to an embodiment of the disclosure.

On a first aspect, an embodiment of the present disclosure provides a display panel. The display panel includes: a display substrate having a through hole which runs through the display substrate in a thickness direction; and an anti-reflective film disposed on a light-emitting surface of the display substrate. The anti-reflective film includes a light-transmitting structure and an anti-reflective structure, and an orthographic projection of the light-transmitting structure on the display substrate covers the through hole.

In some embodiments, the anti-reflective structure is a polarizer.

In some embodiments, the polarizer includes a linear polarizer and a quarter-wave plate, and the linear polarizer is disposed on a side, facing away from the display substrate, of the quarter-wave plate.

In some embodiments, the light-transmitting structure and the polarizer are of an integral structure.

In some embodiments, the anti-reflective structure is a color filter.

In some embodiments, the light-transmitting structure is made of transparent materials.

In some embodiments, the display panel further includes: a touch layer, where the touch layer is disposed between the display substrate and the anti-reflective film, and an orthographic projection of the wiring of the touch layer on the display substrate is not overlapped with the through hole.

In some embodiments, the display panel further includes: a transparent cover plate, where the transparent cover plate is disposed at a side, facing away from the display substrate, of the anti-reflective film.

In some embodiments, the display panel further includes: a touch layer, where the touch layer is disposed on a side, facing away from the display substrate, of the transparent cover plate, and an orthographic projection of the wiring of the touch layer on the display substrate is not overlapped with the through hole.

On a second aspect, the present disclosure further provides a display device, including the display panel mentioned in the first aspect, and a camera module accommodated in the through hole.

On a third aspect, the present disclosure further provides a preparation method of the display panel mentioned in the first aspect. The preparation method includes: forming the display substrate; cutting the display substrate, to form a through hole which runs through the display substrate in a thickness direction; and forming an anti-reflective film on a light-emitting surface of the display substrate. The anti-reflective film includes a light-transmitting structure and an anti-reflective structure, and an orthographic projection of the light-transmitting structure on the display substrate covers the through hole.

In some embodiments, when the anti-reflective structure is a polarizer, forming an anti-reflective film on a light-emitting surface of the display substrate includes: attaching a polarizer to the light-emitting surface of the display substrate, where the polarizer at least covers the display area and the through hole of the display substrate; and discoloring the area, covering the through hole, of the polarizer, to form the light-transmitting structure.

In some embodiments, when the anti-reflective structure is a polarizer, forming an anti-reflective film on the light-emitting surface of the display substrate includes: providing a polarizer; discoloring a first area of the polarizer, to form the light-transmitting structure at the first area; and attaching the polarizer to the light-emitting surface of the display substrate, where an orthographic projection of the first area on the display substrate covers the through hole.

In some embodiments, when the anti-reflective structure is the color filter, the forming an anti-reflective film on the light-emitting surface of the display substrate specifically includes: forming a color filter on the display substrate, where an orthographic projection of the color filter on the display substrate is not overlapped with the through hole; and filling transparent materials to the area, corresponding to the through hole, of the color filter on the light-emitting surface of the display substrate.

DETAILED DESCRIPTION OF THE EMBODIMENTS

As stated above, integrated cutting on the display module is adopted for forming the through hole on the display surface side to place the camera module. During the cutting, a display substrate, a polarized structure and a touch structure all need to be cut. However, too many layers need to be cut, which is likely to influence the display area adjacent to the through hole, such as cracks are easily increased, and to bring a problem of increasing the border of the through hole, thereby influencing process yield and aesthetics of the final products.

Aiming at the above problems existing in the related art, embodiments of the present disclosure provide a display panel, a preparing method thereof and a display device. A clear and complete description will be given below on the technical solutions in embodiments of the present disclosure in combination with accompanying drawings in embodiments of the present disclosure. Apparently, the described embodiments are only a part but not all of the embodiments of the present disclosure. Based upon the embodiments of the present disclosure, all of the other embodiments obtained by those skilled in the art without any creative effort shall all fall within the protection scope of the present disclosure.

The thickness and shape of each layer of film in the accompanying drawings do not reflect true proportions, merely aiming at schematically illustrating the content of the present disclosure.

Figure 1:
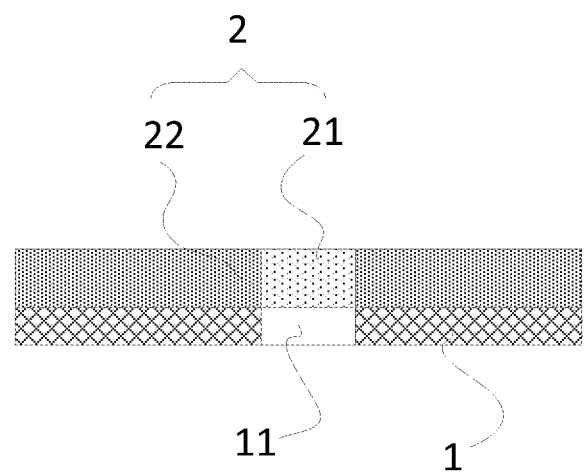
FIG. 1 is a structural schematic diagram of a display panel according to an embodiment of the present disclosure.

As shown in FIG. 1, which is a structural schematic diagram of a display panel according to an embodiment of the present disclosure, a display panel includes:

a display substrate 1, where the display substrate 1 has a through hole 11 which runs through the display substrate 1 in thickness direction; and an anti-reflective film 2, where the anti-reflective film 2 is disposed on a light-emitting surface of the display substrate 1, the anti-reflective film 2 includes a light-transmitting structure 21 and an anti-reflective structure 22, and an orthographic projection of the light-transmitting structure 21 on the display substrate 1 covers the through hole 11.

In the display panel according to an embodiment of the present disclosure, a through hole is formed only on the display substrate, to place a camera module (not shown in the figure). The anti-reflective film disposed on the light-emitting surface of the display substrate includes a light-transmitting structure and an anti-reflective structure. Here the light-transmitting structure has a favorable transparency (with a transmittance of greater than 80%), and an orthographic projection of the light-transmitting structure on the display substrate covers the through hole formed in the display substrate. The light-transmitting structure allows the ambient light incident into the through hole, for the camera module to acquire sufficient ambient light, to satisfy the requirement of imaging. The anti-reflective structure covers the display area of the display substrate, to prevent an influence of ambient light on the display of each pixel.

It can be seen from the above that, in an embodiment of the present disclosure, a through hole is formed only on the display substrate. No through hole is formed on the anti-reflective film, rather, a light-transmitting structure is provided for a light-transmitting effect. Compared with the related art in which a through hole needs to be formed on both the display substrate and the polarized structure, the thickness of the formed through hole in the embodiments of present application is greatly reduced, since the thickness of the display substrate is about 20 μm, and the thickness of the polarized structure is greater than 100 μm. Thus the display panel according to an embodiment of the present disclosure reduces the number of layers to be cut, lowers difficulty in forming a through hole, reduces cracks and decreases width of the border of a through hole, and thus improves process yield and aesthetics of products.

It should be noted that, a border of a through hole is a non-display area located between the through hole and the display area. Since the forming of a through hole inevitably leads to a certain change (for example, cracks) in the structure in the area adjacent to the through hole, a border of a through hole with a certain width can be set to reduce the influence on the display structure in the display area, and ensure normal display of the display area.

In some embodiments, the through hole can be set at any position of the display substrate according to actual requirements, and the shape of the through hole can be a circle, an oval, a rectangle, a rounded rectangle, etc., which is selected according to actual requirements, and is not specifically defined herein.

Figure 2:
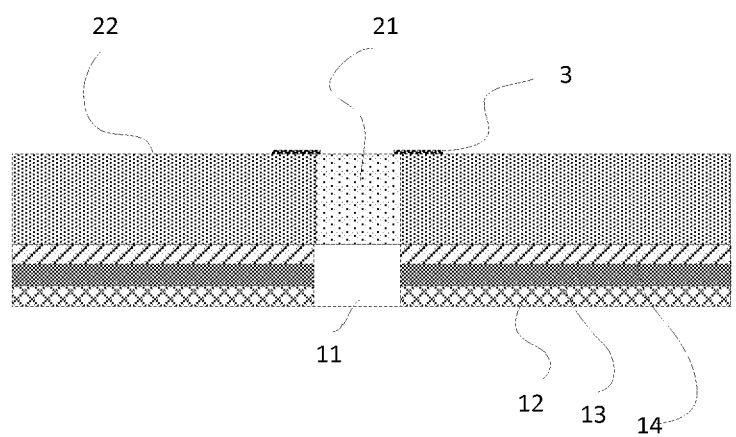
FIG. 2 is a structural schematic diagram of another display panel according to an embodiment of the present disclosure.

In some embodiments, as shown in FIG. 2, the display substrate includes: a substrate 12, a driving structure 13 disposed on the substrate 12, and a light-emitting structure 14 disposed on the driving structure 13. The through hole 11 runs through the substrate 12, the driving structure 13 and the light-emitting structure 14. Here the driving structure 13 and the light-emitting structure 14 according to an embodiment of the present disclosure are the same as the driving structure and the light-emitting structure in the related art, can be implemented with reference to the related art, and will not be repeated redundantly herein. In some embodiments, the display substrate can be an OLED display substrate.

In some embodiments, as shown in FIG. 2, an annular shading layer 3, corresponding to an edge of the through hole 11, is disposed at a side, facing away from the display substrate, of the anti-reflective film. The annular shading layer 3 has an opening corresponding to the through hole 11, and an orthographic projection of the annular shading layer 3 on the display substrate 1 and the surrounding part of the through hole 11 in the display substrate 1 has an overlapping area. That is, an orthographic projection of the opening in the annular shading layer 3 on the display substrate is located within the through hole 11 in the display substrate. The area of the opening in the annular shading layer 3 is smaller than the area of the through hole 11, that is, the annular shading layer 3 can shield the surrounding part of the through hole 11, thus can shield the wiring in the display panel around the through hole 11. That is, edge area of the through hole can be shielded by the annular shading layer, without influencing the aesthetics of the display surface while preventing light leakage.

In some embodiments, the anti-reflective structure can be a polarizer, the polarizer can include a linear polarizer and a quarter-wave plate, and the linear polarizer is disposed on a side, facing away from the display substrate, of the quarter-wave plate, so as to reduce reflection of a metal electrode in the display substrate to external natural light, and improve the display effect.

In some embodiments, in the anti-reflective film according to an embodiment of the present disclosure, the light-transmitting structure and the polarizer can be of an integral structure. That is, a polarizer with the part corresponding to the through hole being discolored, is provided. That is, the part, corresponding to the through hole, of the polarizer forms a light-transmitting structure. Here forming the part, corresponding to the through hole, in the polarizer as a light-transmitting structure, includes: applying ultraviolet light to the part, corresponding to the through hole, of the polarizer; or, a chemical method, which partially discolor the part, corresponding to the through hole, in the polarizer. It should be noted that, other manners can also be adopted to form a light-transmitting structure at the position, corresponding to the through hole, of the polarizer, which is not defined in the present embodiment.

In some embodiments, when the polarizer is set to be a circular polarizer, the discoloring the polarizer includes: depolarizing the part, corresponding to the through hole, of the linear polarizer, and disabling the part, corresponding to the through hole, of the quarter-wave plate, and thus the quarter-wave plate can have a high transparency, then the part, corresponding to the through hole, of the linear polarizer and the quarter-wave plate constitutes a light-transmitting structure.

In some embodiments, the anti-reflective structure is a color filter, and the color filter includes multiple color resists. No color resist is arranged at the position, corresponding to the through hole, of the color filter. That is, a hollow structure is arranged at the part, corresponding to the through hole, in the color filter. When the part, corresponding to the through hole, in the color filter is set to be a hollow structure, transparency can be improved. Thus, the hollow structure can act as a light-transmitting structure. Here, the color filter can be formed through a manner of ink-jet printing.

In some embodiments, transparent materials can be filled in the hollow area provided with no color resist to form a light-transmitting structure. That is, the hollow structure of the color filter is filled with transparent materials with favorable transparency to form a complete structure with a relatively high light transmissivity.

Figure 3:
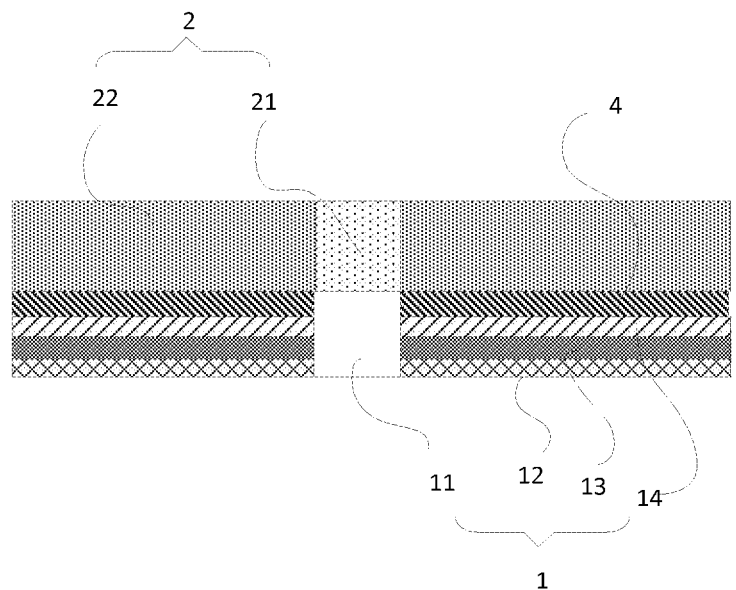
FIG. 3 is a structural schematic diagram of still another display panel according to an embodiment of the present disclosure.

In some embodiments, as shown in FIG. 3, the display panel according to an embodiment of the present disclosure further includes: a touch layer 4 located between the display substrate 1 and the anti-reflective film 2, and an orthographic projection of the wiring of the touch layer 4 on the display substrate 1 is not overlapped with the area in which the through hole 11 is located. That is, the wiring in the touch layer 4 bypasses the position corresponding to the through hole 11, to avoid shading, and ensure a higher light transmissivity.

In some embodiments, a binder is arranged between the touch layer and the display substrate, and the binder bonds the touch layer with the display substrate.

Figure 4:
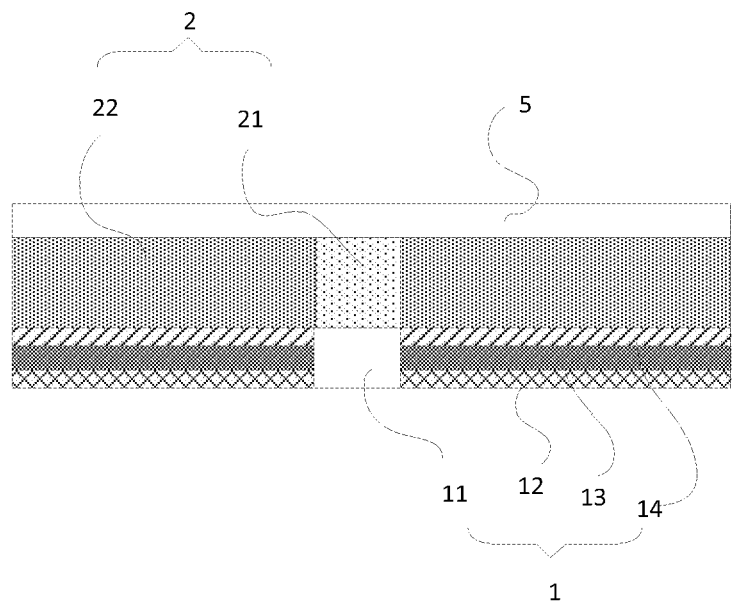
FIG. 4 is a structural schematic diagram of still another display panel according to an embodiment of the present disclosure.

In some embodiments, as shown in FIG. 4, the display panel provided in the present disclosure further includes: a transparent cover plate 5. The transparent cover plate 5 is disposed on a side, facing away from the display substrate 1, of the anti-reflective film 2, and the transparent cover plate 5 can be bonded to the side, facing away from the display substrate 1, of the anti-reflective film 2 through a binder (not specifically shown in the figure), thereby playing a protective effect on the display panel.

Figure 5:
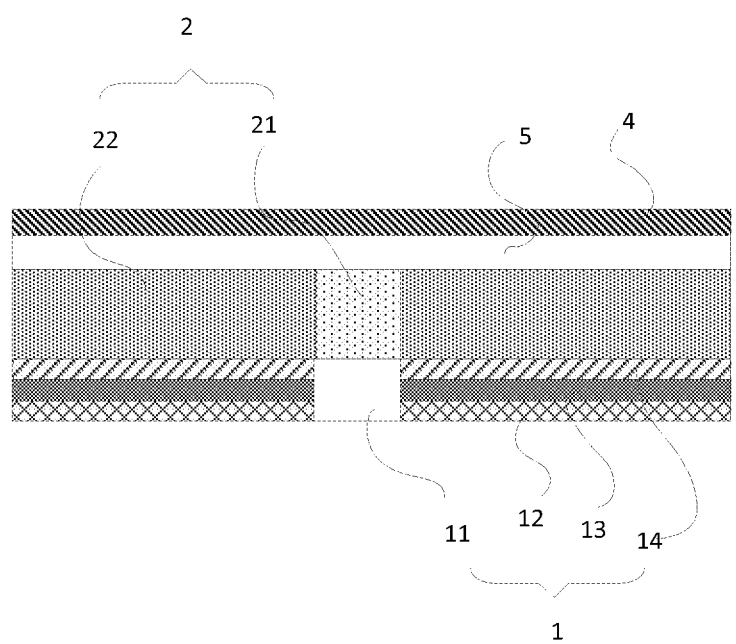
FIG. 5 is a structural schematic diagram of still another display panel according to an embodiment of the present disclosure.

In some embodiments, as shown in FIG. 5, the touch layer 4 according to an embodiment of the present disclosure can be located on a side, facing away from the display substrate 1, of the transparent cover plate 5, and an orthographic projection of the wiring of the touch layer 4 on the display substrate 1 is not overlapped with the through hole 11. That is, the wiring in the touch layer 4 bypasses the position corresponding to the through hole 11, to avoid shading, and ensure a higher light transmissivity.

Based on the same inventive concept, an embodiment of the present disclosure further provides a display device. The display device includes any arbitrary display panel provided in the above embodiments, and a camera module arranged in the through hole. It can be understood that, the display device provided with the above display panel can also easily lower difficulty in forming a through hole, reduce cracks and decrease width of the border of a through hole, and improve process yield and aesthetics of products.

Based on the same inventive concept, an embodiment of the present disclosure further provides a preparation method of the display panel, including:

forming the display substrate;

cutting the display substrate, to form a through hole which runs through the display substrate in a thickness direction; and forming an anti-reflective film on a light-emitting surface of the display substrate, where the anti-reflective film includes a light-transmitting structure and an anti-reflective structure, and an orthographic projection of the light-transmitting structure on the display substrate covers the through hole.

The above preparation method can be used to prepare a display panel. When the through hole is prepared, a through hole only needs to be formed on the display substrate, and the anti-reflective film is formed with a light-transmitting structure corresponding to the through hole. A through hole is avoided in the anti-reflective film, thereby effectively reducing the film layers to be cut. Compared with the through hole cutting in the related art, the number and thickness of the film layers to be cut are reduced, thereby alleviating the problems of increased heat affected zone and increased crack risks in a case that too many layers has to be cut. Meanwhile, a reduction in the film layers to be cut can also effectively reduce the border of the through hole, and improve process yield and aesthetics of products.

In some embodiments, when the anti-reflective structure is a polarizer, forming an anti-reflective film at a light-emitting surface of the display substrate includes: attaching one polarizer to the light-emitting surface of the display substrate, where the polarizer at least covers the display area and the through hole of the display substrate; and discoloring the area, covering the through hole, of the polarizer, to form the light-transmitting structure. That is, the polarizer is firstly attached to the display substrate, and then the area, corresponding to the through hole, in the polarizer is discolored, to form a light-transmitting structure.

In some embodiments, when the anti-reflective structure is a polarizer, the forming an anti-reflective film on a light-emitting surface of the display substrate specifically includes: providing one polarizer; discoloring a first area of the polarizer, to form the light-transmitting structure at the first area; and attaching the polarizer containing the light-transmitting structure to a light-emitting surface of the display substrate, where an orthographic projection of the first area on the display substrate covers the through hole. That is, before the polarizer is attached to the display substrate, the preset area, corresponding to the through hole, of the display panel is discolored, to form a light-transmitting structure, and then the polarizer formed with a light-transmitting structure is attached to the display substrate in an aligned manner.

The forming manners of the above two anti-reflective films can be selected according to actual using conditions, and will not be specifically defined herein.

In some embodiments, when the anti-reflective structure is the color filter, the forming an anti-reflective film on a light-emitting surface of the display substrate specifically includes:

forming a color filter on the display substrate, where an orthographic projection of the color filter on the display substrate is not overlapped with the through hole; and filling transparent materials to the area, corresponding to the through hole, of the color filter on the light-emitting surface of the display substrate.

When a color filter is formed on the display substrate as mentioned above, a color filter can be formed through a manner of ink-jet printing, and no color resist is arranged at the position, corresponding to the through hole, of the color filter to form a hollow structure. It should be noted that, the color filter can also be formed in other manners, which is not defined in the present embodiment.

Related implementation manners of the preparation method of the display panel according to an embodiment of the present disclosure have been described in detail in the above embodiments of the display panel, and the preparation method can be implemented with reference to the related embodiments of the display panel, and will not be repeated redundantly herein.

Embodiments of the present disclosure provide a display panel, a preparation method thereof and a display device. The display panel includes: a display substrate, where the display substrate has a through hole which runs through the display substrate in a thickness direction; and an anti-reflective film, where the anti-reflective film is arranged on a light-emitting surface of the display substrate, the anti-reflective film includes a light-transmitting structure and an anti-reflective structure, and an orthographic projection of the light-transmitting structure on the display substrate covers the through hole. In the embodiments of the present disclosure, a through hole is formed only on the display substrate, and no through hole is formed on the anti-reflective film, rather, a light-transmitting structure is provided for a light-transmitting effect. Compared with the related art, the thickness of the formed through hole is greatly reduced, thereby lowering difficulty in forming a through hole, reducing cracks and decreasing width of the border of a through hole, and improving process yield and aesthetics of products.

Evidently, those skilled in the art can make various modifications and variations to the embodiments of the present disclosure without departing from the spirit and scope of the present disclosure. Accordingly, the present disclosure is also intended to encompass these modifications and variations thereto so long as the modifications and variations come into the scope of the claims appended to the disclosure and their equivalents.

What is claimed is:

1. A display panel, comprising:
   a display substrate, wherein the display substrate has a through hole running through the display substrate in a thickness direction; and
   an anti-reflective film, wherein the anti-reflective film is disposed on a light-emitting surface of the display substrate, the anti-reflective film comprises a light-transmitting structure and an anti-reflective structure, and an orthographic projection of the light-transmitting structure on the display substrate covers the through hole.

2. The display panel of claim 1, wherein the anti-reflective structure is a polarizer.

3. The display panel of claim 2, wherein the polarizer comprises a linear polarizer and a quarter-wave plate, and the linear polarizer is disposed on a side, facing away from the display substrate, of the quarter-wave plate.

4. The display panel of claim 2, wherein the light-transmitting structure and the polarizer are of an integral structure.

5. The display panel of claim 1, wherein the anti-reflective structure is a color filter.

6. The display panel of claim 5, wherein the light-transmitting structure is made of transparent materials.

7. The display panel of claim 1, further comprising:
   a touch layer;
   wherein the touch layer is disposed between the display substrate and the anti-reflective film, and an orthographic projection of wiring of the touch layer on the display substrate is not overlapped with the through hole.

8. The display panel of claim 1, further comprising:
   a transparent cover plate;
   wherein the transparent cover plate is disposed on a side, facing away from the display substrate, of the anti-reflective film.

9. The display panel of claim 8, further comprising:
   a touch layer;
   wherein the touch layer is disposed on a side, facing from the display substrate, of the transparent cover plate, and an orthographic projection of wiring of the touch layer on the display substrate is not overlapped with the through hole.

10. A display device, comprising the display panel of claim 1, and a camera module accommodated in the through hole.

11. A preparation method of the display panel of claim 1, wherein the preparation method comprises:
    forming the display substrate;
    cutting the display substrate, to form a through hole which runs through the display substrate in a thickness direction; and
    forming an anti-reflective film on a light-emitting surface of the display substrate, wherein the anti-reflective film comprises a light-transmitting structure and an anti-reflective structure, and an orthographic projection of the light-transmitting structure on the display substrate covers the through hole.

12. The preparation method of the display panel of claim 11, wherein when the anti-reflective structure is a polarizer, forming the anti-reflective film on the light-emitting surface of the display substrate comprises:
    attaching a polarizer to the light-emitting surface of the display substrate, wherein the polarizer at least covers a display area and the through hole of the display substrate; and
    discoloring an area, covering the through hole, of the polarizer, to form the light-transmitting structure.

13. The preparation method of the display panel of claim 11, wherein when the anti-reflective structure is a polarizer, forming the anti-reflective film on the light-emitting surface of the display substrate comprises:
    providing a polarizer;
    discoloring a first area of the polarizer, to form the light-transmitting structure in the first area; and
    attaching the polarizer to the light-emitting surface of the display substrate, wherein an orthographic projection of the first area on the display substrate covers the through hole.

14. The preparation method of the display panel of claim 11, wherein when the anti-reflective structure is the color filter, forming the anti-reflective film on the light-emitting surface of the display substrate comprises:
    forming a color filter on the display substrate, wherein an orthographic projection of the color filter on the display substrate is not overlapped with the through hole; and filling transparent materials to an area, corresponding to the through hole, of color filter the on the light-emitting surface of the display substrate.

* * * * *